(12) United States Patent
Wang et al.

(10) Patent No.: US 10,466,552 B2
(45) Date of Patent: Nov. 5, 2019

(54) ARRAY SUBSTRATE, DISPLAY DEVICE AND MANUFACTURING METHOD FOR THE ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Huibin Guo, Beijing (CN); Yuchun Feng, Beijing (CN); Liangliang Li, Beijing (CN); Zheng Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 107 days.

(21) Appl. No.: 15/564,661

(22) PCT Filed: May 19, 2017

(86) PCT No.: PCT/CN2017/085130
§ 371 (c)(1),
(2) Date: Oct. 5, 2017

(87) PCT Pub. No.: WO2017/202256
PCT Pub. Date: Nov. 30, 2017

(65) Prior Publication Data
US 2018/0203313 A1 Jul. 19, 2018

(30) Foreign Application Priority Data
May 25, 2016 (CN) .......................... 2016 1 0352949

(51) Int. Cl.
*H01L 27/14* (2006.01)
*H01L 29/04* (2006.01)
(Continued)

(52) U.S. Cl.
CPC ...... *G02F 1/136209* (2013.01); *G02F 1/1368* (2013.01); *G02F 1/136286* (2013.01);
(Continued)

(58) Field of Classification Search
CPC ......... G02F 1/136209; G02F 1/136286; G02F 1/1368; G02F 1/136227;
(Continued)

(56) References Cited

U.S. PATENT DOCUMENTS 6,005,648 A * 12/1999 Zhang ............... G02F 1/136209
349/138
2004/0119915 A1 6/2004 Kim
(Continued)

FOREIGN PATENT DOCUMENTS

CN 101546733 A 9/2009
CN 102012589 A 4/2011
(Continued)

OTHER PUBLICATIONS

International Search Report and Written Opinion dated Jun. 30, 2017; PCT/CN2017/085130.

*Primary Examiner* — Calvin Y Choi

(57) ABSTRACT

An array substrate, a display device, and a method for manufacturing the array substrate are disclosed. The array substrate includes a base substrate and a pixel array structure disposed on the base substrate, the pixel array structure includes at least one light shielding layer made of a light shielding material, and the light shielding material can prevent light leakage or light reflection, thereby increasing an opening ratio of the display device.

22 Claims, 3 Drawing Sheets

(51) Int. Cl.
*H01L 29/15* (2006.01)
*H01L 31/036* (2006.01)
*G02F 1/1362* (2006.01)
*G02F 1/1368* (2006.01)
*H01L 27/12* (2006.01)
*H01L 29/786* (2006.01)
*G02F 1/1343* (2006.01)

(52) U.S. Cl.
CPC ........ *H01L 27/124* (2013.01); *H01L 27/1248* (2013.01); *H01L 27/1259* (2013.01); *H01L 27/1262* (2013.01); *H01L 29/78633* (2013.01); *G02F 1/136227* (2013.01); *G02F 2001/134372* (2013.01); *G02F 2001/136222* (2013.01); *G02F 2201/121* (2013.01); *G02F 2201/40* (2013.01)

(58) Field of Classification Search
CPC ........ G02F 2001/134372; G02F 2001/136222; G02F 2201/121; G02F 2201/40; H01L 27/124; H01L 27/1248; H01L 27/1259; H01L 27/1262; H01L 29/78633

USPC .......................................................... 257/72
See application file for complete search history.

(56) References Cited

U.S. PATENT DOCUMENTS

| | | | |
|---|---|---|---|
| 2008/0100565 A1* | 5/2008 | Song | G09G 3/3433 345/107 |
| 2011/0001909 A1* | 1/2011 | Tseng | G02F 1/136209 349/106 |
| 2015/0179668 A1 | 6/2015 | Niu | |
| 2015/0303150 A1 | 10/2015 | Choi et al. | |
| 2016/0195751 A1 | 7/2016 | Niu | |

FOREIGN PATENT DOCUMENTS

| | | |
|---|---|---|
| CN | 103199095 A | 7/2013 |
| CN | 103353699 A | 10/2013 |
| CN | 103681693 A | 3/2014 |
| CN | 105842904 A | 8/2016 |

* cited by examiner

ARRAY SUBSTRATE, DISPLAY DEVICE AND MANUFACTURING METHOD FOR THE ARRAY SUBSTRATE

TECHNICAL FIELD

Embodiments of the present disclosure relate to an array substrate, a display device and a manufacturing method for the array substrate.

BACKGROUND

A display panel is typically formed by cell-assembling an array substrate and a color filter substrate. Metal electrodes/wires disposed on the array substrate generate lateral electrical fields after being applied power, and such electrical fields will cause liquid crystal molecules disposed adjacent to the metal electrodes/wires to defect disorderedly, and in turn, a phenomenon of light leakage will occur in the display panel. In order to prevent light leakage in the display panel due to the lateral electrical fields generated by the metal electrodes/wires, a black matrix is typically disposed on the color filter substrate, so as to prevent light leakage due to the lateral electrical fields generated by the metal electrodes/wires and to avoid influence on leakage current in a channel region of a TFT (TFT) by external light irradiation.

As a certain offset will occur when cell-assembling the color filter substrate and the array substrate, size of the black matrix is designed to be greater than necessary, which cause the opening ratio of the display panel to decrease.

SUMMARY

According to one aspect of the present disclosure, an array substrate is provided, which comprising a base substrate and a pixel array structure, wherein the pixel array structure comprises at least one light shielding layer made of a light shielding material.

According to another aspect of the present disclosure, a display device is provided, which comprising the array substrate mentioned above.

According to still another aspect of the present disclosure, a manufacturing method for an array substrate, comprising: providing a base substrate, and forming a pixel array structure on the base substrate, wherein the pixel array structure comprises at least one light shielding layer made of a light shielding material.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

Figure 1A:
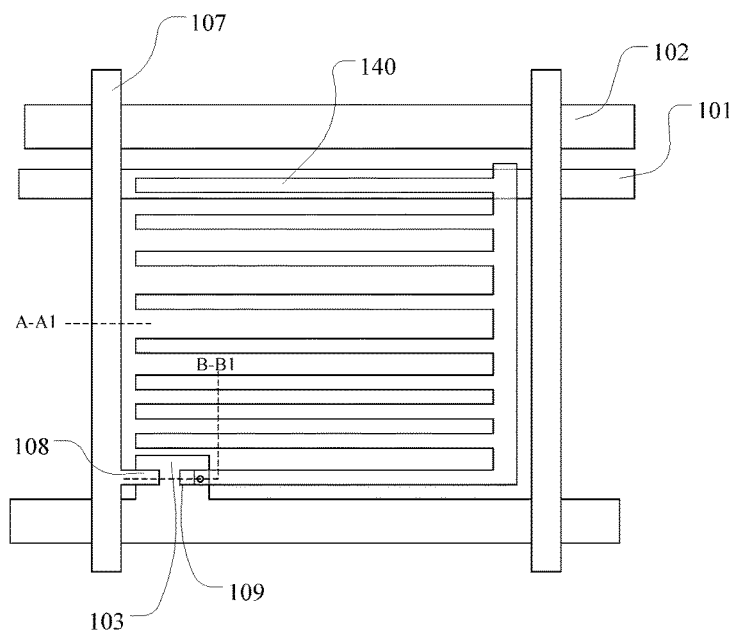
FIG. 1a is an illustrative top view of an array substrate according to one embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In a display panel, a black matrix is typically disposed on a side of a color filter substrate. A position where the black matrix is disposed can comprise a position above metal electrodes/wires of an array substrate, so as to avoid light leakage caused by disordered deflection of liquid crystal molecules disposed adjacent to the metal electrodes/wires due to lateral electrical fields generated by the metal electrodes/wires. A position where the black matrix is disposed can comprise a position above a channel region of a TFT, so as to avoid leakage current generated due to light irradiation incident on the channel region of the TFT. When cell-assembling the array substrate and the color filter substrate, an offset in relative position of the array substrate and the color filter substrate may occur. Thus, size of the black matrix is typically designed to be greater than necessary, so as to eliminate adverse effect caused by the offset in cell-assembling. However, with a rudiment design that the size of the black matrix is designed to be greater, the opening ratio of the display panel will decrease in turn.

According to one aspect of the present disclosure, embodiments provide an array substrate, comprising a base substrate and a pixel array structure disposed on the base substrate, the pixel array structure comprises at least one light shielding layer made of a light shielding material. For example, the pixel array substrate further comprises a TFT which comprises a pattern of active layer and the light shielding layer is disposed at least corresponding to the pattern of active layer. For example, in a direction perpendicular to the base substrate, the light shielding layer is disposed at least partially overlapping a channel region of the pattern of active layer, or entirely overlapping the pattern of active layer, so as to make the light shielding layer corresponding to the pattern of active layer.

For example, the pixel array substrate comprises a pattern of source/drain metal layer, and the pattern of source/drain metal layer comprises source/drain electrodes of the TFT and data lines, and a light shielding layer is provided on at least part of a surface of the pattern of source/drain metal layer away from the base substrate so as to provide a light shielding layer.

For example, the pixel array substrate further comprises a pattern of gate metal layer, a common electrode, a pixel electrode and the like. A light shielding material is provided at least on a surface of at least one of the pattern of gate metal layer, the common electrode and the pixel electrode away from the base substrate so as to provide a light shielding layer.

The light shielding layer can block light incident thereon and can also reduce reflection of light incident thereon. Thus, influence of the light on display effect, especially influence of the light on the channel region of the active layer of the TFT, can be reduced, thereby improving performance of the TFT and enhancing display effect.

For example, the light shielding layer is provided at least on a surface of the source/drain metal layer away from the base substrate. For example, the surface of the source/drain metal layer away from the base substrate is entirely provided with a light shielding material, or a part of the surface of the source/drain metal layer away from the base substrate is provided with a light shield material. For example, a light shielding material provided on a surface of data lines away from the base substrate has a size in the direction of the width of the data line equal to the width of the data line. For example, a shielding layer is provided on a surface of a part of the data line away from the base substrate, while for the other part of the data line, a black matrix is still provide corresponding to the other part of the data line so as to avoid light leakage. For example, a black matrix is provided at a side of the color filter substrate. The light shield material is provided on the surface of the source/drain metal layer away from the base substrate through, for example, deposition or sputtering method.

Embodiment One

FIG. 1a is an illustrative top view of a pixel unit (sub-pixel) of an array substrate according to one embodiment of the present disclosure. Referring to FIG. 1a, each pixel unit in the array substrate is defined by a gate line 102 and a data line 107 crossing each other, and a TFT (TFT) functioning as a switching element is provided at a position adjacent to the crossing position of the gate line 102 and the data line. For example, a source electrode 108 of the TFT is connected to the data line 107, and the drain electrode 109 is connected to the pixel electrode 140. For example, a common electrode line 101 and the gate line 102 are provided on the same level and are extended parallel to each other.

It should be noted that, even though FIG. 1a illustratively illustrates a structure of the pixel unit, for example, the pixel electrode has a shape of comb, it is not intended to limit the present disclosure thereto. For example, the pixel electrode can also have a shape of block or other shapes.

Figure 1B:
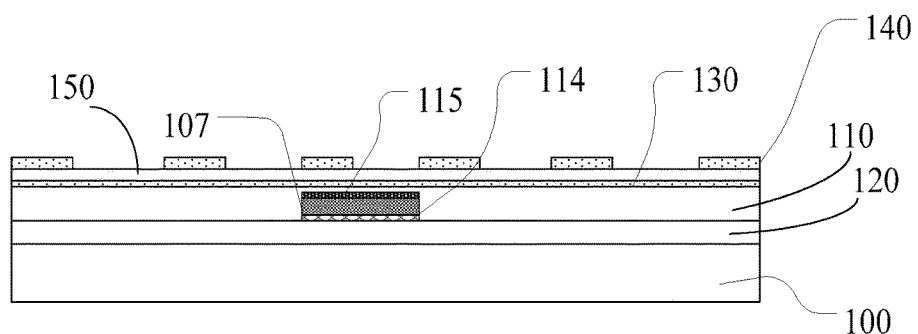
FIG. 1b is a cross-sectional view of the array substrate as illustrated in FIG. 1a, as taken along the direction A-A1.
Figure 1C:
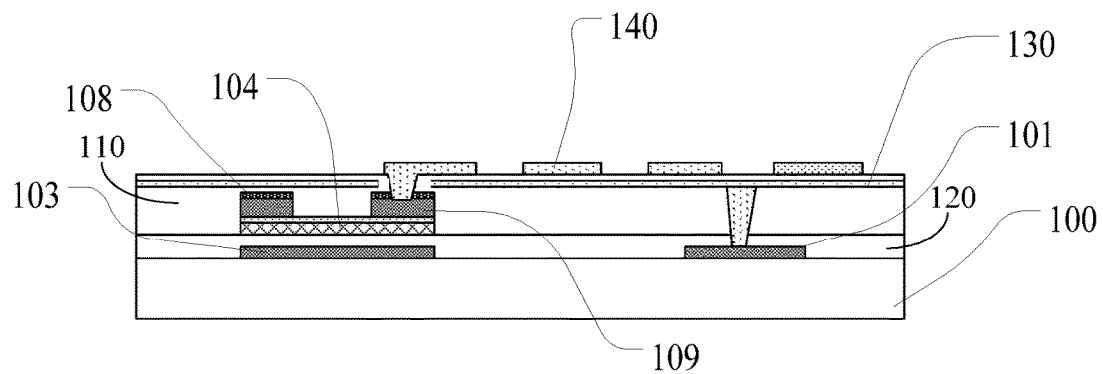
FIG. 1c is a cross-sectional view of the array substrate as illustrated in FIG. 1a, as taken along the direction B-B1.

FIG. 1b is a cross-sectional view of the array substrate in FIG. 1a taken along the direction A-A1, and FIG. 1c is a cross-sectional view of the array substrate in FIG. 1a taken along the direction B-B1. (Similarly, the cross-sectional views of the array substrate illustrated in FIG. 2 to FIG. 7 are taken along the direction B-B1, which are indicated in general.)

Referring to FIG. 1b and FIG. 1c, the array substrate comprises a base substrate 100 and a pixel array structure provided on the base substrate 100. The pixel structure comprises: a pattern of gate metal layer which comprises a gate electrode and a gate line 103 connected with the gate electrode, a gate insulating layer covering the pattern of gate metal layer, and a pattern of source/drain metal layer comprising a data line 107, a source electrode 108 connected with the data line 107, and a drain electrode connected with the pixel electrode 140.

In the pixel array substrate, for example, the pattern of gate metal layer can further comprise a common electrode line 101. Again for instance, the pattern of active layer can further comprise a portion 114 disposed below the data line.

Referring to FIG. 1b in connection with FIG. 1c, a light shielding material 115 is provided at a side of the pattern of source/drain electrodes away from the base substrate 100 so as to provide a light shielding layer. The light shielding material can avoid light leakage or light reflection caused by the source/drain metal layer, thereby increasing the opening ratio of the display device.

In one embodiment of the present disclosure, continuing referring FIG. 1c, as described above, the pixel array structure comprises a pattern of active layer between the base substrate and the pattern of source/drain metal layer, the pattern of active layer comprising a channel region 104 between the source electrode 108 and the drain electrode 109 of the TFT. That is, the channel region is disposed between a source region and a drain region of the active layer which are disposed corresponding to the source electrode 108 and the drain electrode 109, respectively, so as to make the source/drain electrodes of the TFT are conducted by the channel region 104 when the gate electrode corresponding to the channel region is applied a voltage.

In one embodiment of the present disclosure, for example, a pattern of the light shielding material completely overlaps the pattern of source/drain metal layer in a direction of thickness of the base substrate. That is to say, a side of the source/drain metal layer away from the base substrate is all provided with a light shielding material, so as to effectively block light leakage caused by the data lines.

In one embodiment of the present disclosure, for example, the pixel array substrate can further comprise a common electrode 130. The common electrode 130 covers the data line 107 and the TFT at least, thereby shielding stray electric fields generated by the data line 107. And further, similarly, the common electrode 130 can further cover the gate line 101, thereby shielding stray electric fields generated by the gate line 101.

In the pixel array structure, the pattern of gate metal layer is formed on the base substrate 100, the gate insulating layer 120 covers the pattern of gate metal layer, the pattern of active layer and the pattern of source/drain metal layer are formed on the gate insulating layer 120, a planarization layer 110 covers the pattern of active layer and the pattern of source/drain metal layer, the common electrode 130 is formed on the planarization layer 110, an interlayer insulating layer 150 covers the common electrode 130, and the pixel electrode 140 is disposed on the interlayer insulating layer 150. For example, the planarization layer 110 and the interlayer insulating layer 150 can be formed of a same inorganic or organic insulating material. In an example of the embodiment, the common electrode 130 and the pixel electrode 140 are not formed on the same level, thus, an array substrate of ADS (Advanced super Dimension Switch) mode can be formed. But the present disclosure is not limited thereto. For example, the common electrode and the pixel electrode are formed on the same level, and thus an array substrate of IPS (In-Plane Switching) mode is formed.

Embodiment Two

Figure 2:
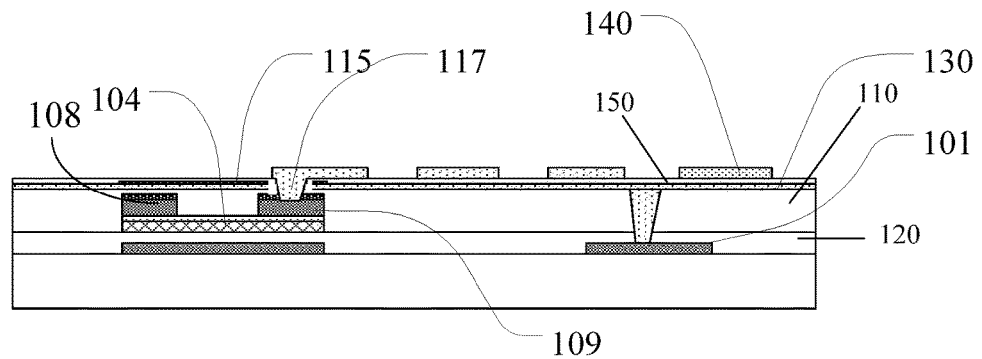
FIG. 2 is an illustrative view of an array substrate according to another embodiment of the present disclosure, wherein a light shielding material is disposed on a common electrode of the array substrate corresponding to a channel region of a TFT.

FIG. 2 is an illustrative view of an array substrate according to another embodiment of the present disclosure, wherein a light shielding material is disposed on a region of a common electrode of the array substrate corresponding to a channel region of a TFT.

Referring to FIG. 2, a pattern of gate metal layer, a gate insulating layer 120, a pattern of active layer, a pattern of source/drain metal layer, a common electrode 130, an interlayer insulating layer 150 and a pixel electrode 140 are disposed on the base substrate 100. The pattern of active layer comprises a channel region 104, and a light shielding material 115 is provided on a surface of the common electrode 130 away from the base substrate 100 and corresponding to the channel region 104, so as to provide a light shielding layer. The channel region of the TFT will generate leakage current upon light irradiation, thereby affecting display effect. A light shielding layer is provided by disposing a light shielding material on a surface of the common electrode away from the base substrate, and the light shielding layer is disposed corresponding to the channel region of the TFT at least, for example, covering the channel region of the TFT or the entire pattern of active layer in a direction perpendicular to the base substrate, thereby preventing light from being incident on the channel region of the TFT and ensuring the display effect of the display device.

In an example of the embodiment, as illustrated in FIG. 2, the pixel array substrate can further comprise a planarization layer 110, a pixel electrode 140 insulated from the common electrode 130, and an interlayer insulating layer 150 disposed between the common electrode 130 and the pixel electrode 140, wherein the pixel electrode 140 can be connected to the drain electrode of the TFT through the first through hole passing through the interlayer insulating layer 150, the common electrode 130 and the planarization layer 110 when the pixel electrode 140 is formed above the common electrode 130.

In the examples of the embodiment, the common electrode 130 and the pixel electrode 140 are not formed on the same level, but the present disclosure is not limited thereto. For example, the common electrode and the pixel electrode can be formed on the same level. And further, a light shielding material 115 is provided on a surface of the common electrode 130 away from the base substrate 100 and corresponding to the channel region 104 of the TFT, so as to provide a light shielding layer. For example, the light shielding material 115 at least partially overlap the source/drain electrodes in the thickness direction of the base substrate so as to protect the source/drain electrodes better. For example, a light shielding material is each provided on a surface of the common electrode 130 away from the base substrate 100 and corresponding to the pattern source/drain metal layer so as to provide a light shielding layer, thereby prevent light leakage better. The pixel electrode 140 can be connected to the drain electrode 109 through the first through hole 117 passing through the interlayer insulating layer 150, the light shielding material 115, the common electrode 130, the planarization layer 110 and a light shielding material 115 cover the drain electrode 109 at a side of the drain electrode 109 away from the base substrate 110.

A planarization layer is typically disposed on the source/drain metal layer. For example, the planarization layer is made of an organic material, such as polyesters, polyvinyl chloride and the like. In the embodiment, the function of the planarization layer comprises, for example, insulating the source/drain metal layer and the common electrode each other, and covering the source/drain metal layer so as to obtain an even surface, thereby facilitating subsequent processes. Over the planarization layer, for example, the common electrode and the pixel electrode can be formed on a same plane or on different planes, and are applied with different voltages so as to generate an electric field between the common electrode and the pixel electrode for driving the liquid crystal molecules. For example, as illustrated in the figures, the pixel electrode 140 is disposed over the common electrode 130. As the pixel electrode is required to be electrically connected to the drain electrode of the source/drain metal layer, a connection through hole is formed at positions of the interlay insulating layer and the planarization layer corresponding to the drain electrode. Similarly, if necessary, a connection through hole in communication with the through hole formed in the planarization layer is formed at a position in the common electrode corresponding to the drain electrode, or, the common electrode is rounded the position of the connection through hole, that is, the common electrode is formed at a position wherein the through hole is not formed. The pixel electrode is electrically connected to the drain electrode through the connection through hole.

The connection between the pixel electrode and the drain electrode can be realized through the following manners. After forming the first through hole passing through the interlayer insulating layer, the common electrode and the planarization layer, an ITO layer for the pixel electrode is deposited. The ITO material enters the through hole after being deposited, thereby realizing the electrical connection between the pixel electrode and the drain electrode of the TFT.

In one example of the embodiment, the planarization layer is made of an organic material. As described above, the planarization layer can be made of polyvinyl chloride. For example, the planarization layer can further be made of other organic insulating material.

Embodiment Three

Figure 3:
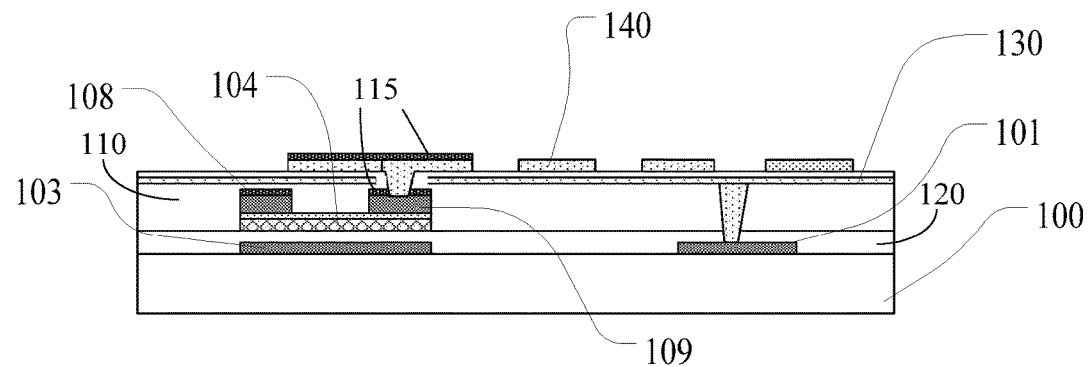
FIG. 3 is an illustrative view of an array substrate according to another embodiment of the present disclosure, wherein a light shielding material is disposed on a pixel electrode of an array substrate corresponding to a channel region of a TFT.

FIG. 3 is an illustrative view of an array substrate according to another embodiment of the present disclosure, wherein a light shielding material is disposed on a region of a pixel electrode of an array substrate corresponding to a channel region of a TFT.

Referring to FIG. 3, a pattern of gate metal layer, a gate insulating layer, a pattern of active layer, a pattern of source/drain metal layer, a common electrode 130 and the pixel electrode 140 are disposed on a base substrate 100. In the embodiment, a light shielding material 115 is also provided on a side of the pixel electrode 140 away from the base substrate and corresponding to the channel region, so as to provide a light shielding layer. As described above, the channel region of the TFT is required to be blocked, so as to prevent leakage current. Thus, a light shielding material can be provided on a surface of the pixel electrode away from the base substrate and corresponding to the channel region. For example, in a direction perpendicular to the base substrate, the light shielding layer is disposed at least partially covering the channel region of the pattern of active layer or covering the entire pattern of active layer. For example, when forming a pattern of the pixel electrode, the pattern of the pixel electrode corresponding to the channel of the TFT is remained so as to provide a light shielding material on the pattern of the pixel electrode corresponding to the channel region of the TFT, thereby effectively protecting the channel region of the TFT. For example, a light shielding material can be further provided on a surface of the pixel electrode corresponding to the patter of source/drain metal layer so as to provide a light shielding layer, thereby more effectively blocking light leakage caused by the source/drain metal layer.

In an example of the embodiment, the pixel array structure further comprises a planarization layer and an interlayer insulating layer which are disposed between the pattern of source/drain metal layer and the pixel electrode, and the pixel electrode is electrically connected to the drain electrode through a through hole passing through the planarization layer and the interlayer insulating layer. As depicted in the figure, the pixel electrode 140 and the common electrode 130 can be disposed on different levels and the pixel electrode 140 is disposed farther away from the base substrate. For example, the pixel electrode 140 is disposed nearer to the base substrate, and the common electrode is disposed farther away from the base substrate. If the pixel electrode and the common electrode are disposed in such a manner, the pixel electrode is adjacent to the interlayer insulating layer. Thus, the pixel electrode is electrically connected to the drain electrode of the TFT through a through hole passing through the interlayer insulating layer and the planarization layer.

Embodiment Four

Figure 4:
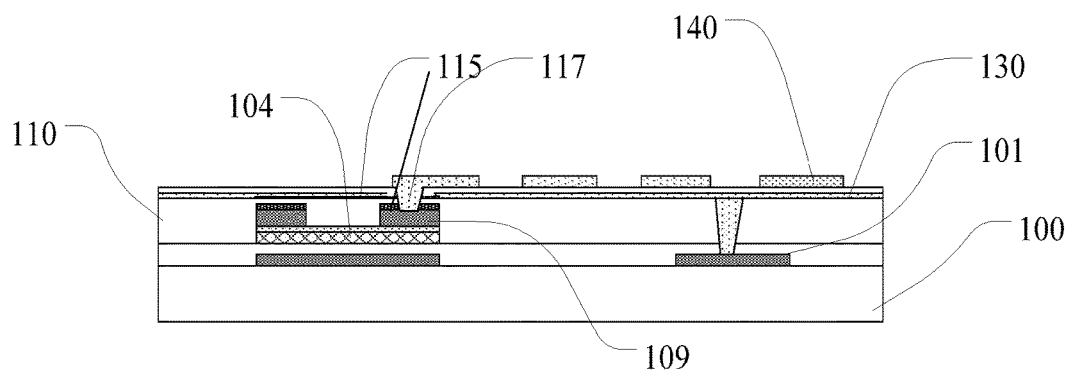
FIG. 4 is an illustrative view of an array substrate according to another embodiment of the present disclosure, wherein a light shielding material is disposed on a planarization layer of an array substrate corresponding to a channel region of a TFT.

In still another embodiment of the present disclosure, a light shielding material is provided on a surface of the planarization layer away from the base substrate and corresponding to the channel region. FIG. 4 is an illustrative view of an array substrate according to one embodiment of the present disclosure, wherein a light shielding material is disposed on the planarization layer of the array substrate corresponding to the channel region of the TFT. Referring to FIG. 4, a pattern of gate metal layer, a gate insulating layer, a pattern of active layer, a pattern of source/drain metal layer, a planarization layer 110, a common electrode 130 and a pixel electrode 140 are disposed on the base substrate 100. A light shielding material 115 is provided on a surface of the pattern of source/drain metal layer (comprising a source electrode 108 and a drain electrode 109 of the TFT and data lines 107) away from the base substrate 100 so as to provide a light shielding layer. The planarization layer 110 covers the light shielding material 115 and the pattern of source/drain metal layer. For example, in a direction perpendicular to the base substrate, the light shielding layer is disposed at least partially covering the channel region of the pattern of active layer or covering the entire pattern of active layer. The pattern of active layer comprises a channel region 104, and a light shielding material 115 is provided on a surface of the planarization layer 110 away from the base substrate 100 and corresponding to the channel region 104 so as to provide a light shielding layer. For example, as described above, the light shielding material 115 at least partially overlaps the source/drain electrodes of the TFT and/or overlaps the pattern of source/drain metal layer each other, in a thickness direction of the base substrate 100, so as to further prevent light leakage. A light shielding material is provided on a surface of the planarization layer 110 away from the base substrate and corresponding to the channel region of the TFT, thereby protecting the channel region of the TFT and preventing leakage current.

Embodiment Five

In yet another embodiment of the present disclosure, a light shielding material is provided on a surface of the pattern of gate metal layer away from the base substrate. The pattern of gate metal layer for example comprises a gate line, a gate electrode connected with the gate line and a common electrode line and the like. Electric fields generated by the metal electrodes/wires after being applied power can make liquid crystal molecule deflect in disorder, which causes light leakage.

Figure 5:
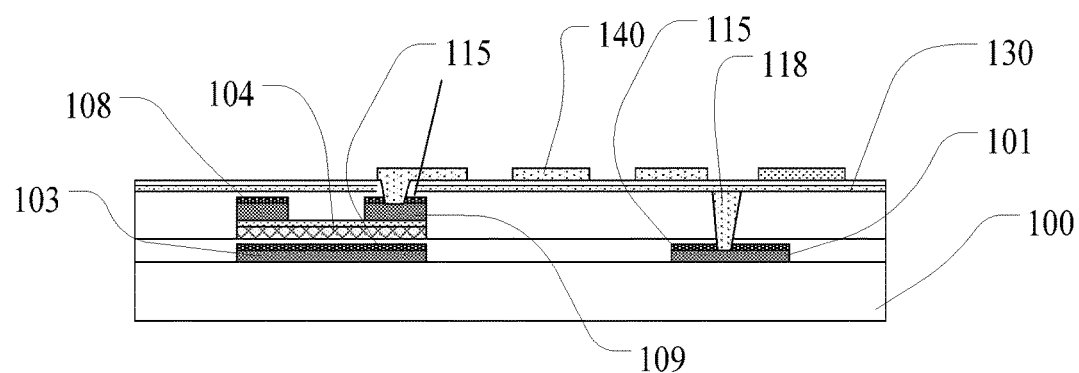
FIG. 5 is an illustrative view of an array substrate according to another embodiment of the present disclosure, wherein a light shielding material is disposed on a gate metal layer of an array substrate.

FIG. 5 illustrates a schematic view of an array substrate according to one embodiment of the present disclosure, wherein a light shielding material is disposed on the gate metal layer. Referring to FIG. 5, the array substrate comprises a base substrate 100 and a pattern of gate metal layer, a gate insulating layer, a pattern of source/drain metal layer, a common electrode 130 and the pixel electrode 140 are disposed on a base substrate 100 in sequence. In the figure, a light shielding material 115 is provided on a surface of the pattern of source/drain metal layer away from the base substrate 100 so as to provide a light shielding layer. And at the same time, a light shielding material is also provided on a surface of the pattern of gate metal layer away from the base substrate so as to provide a light shielding layer. For example, the pattern of gate metal layer comprise a gate line, a gate electrode 103 connected with the gate line, and a common electrode line 101, and a light shielding material is provided on a surface of each of the gate line, the gate electrode and the common electrode line away from the base substrate. That is, a light shielding material is provided on the entire surface of the pattern of gate metal layer away from the base substrate so as to provide a light shielding layer. By providing a light shielding material on the pattern of gate metal layer, light leakage can be further prevented, thereby protecting the channel region of the TFT and increasing the opening ratio of the display device.

Figure 6:
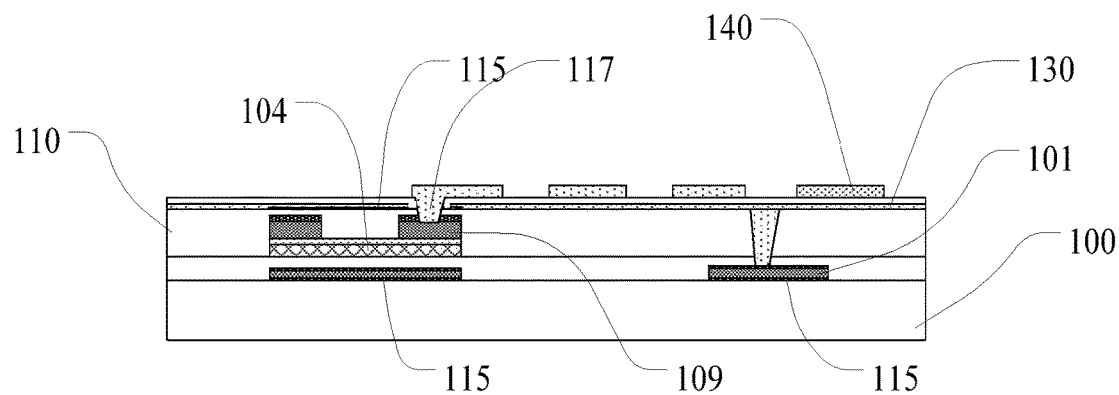
FIG. 6 is an illustrative view of an array substrate according to another embodiment of the present disclosure, wherein a light shielding material is disposed at a side of pattern of a gate metal layer adjacent to a base substrate.

In an example of the embodiment, for example, a light shielding material can be further provided on a surface of the pattern of gate metal layer adjacent to the base substrate so as to provide a light shielding layer. FIG. 6 is an illustrative view of an array substrate according to the embodiment of the present disclosure, wherein a light shielding material is also disposed on a surface of the pattern of gate metal layer adjacent to the base substrate.

Referring to FIG. 6, the array substrate comprises a base substrate 100 and a pattern of gate metal layer, a gate insulating layer, a pattern of source/drain metal layer, a planarization layer, a common electrode 130 and the pixel electrode 140 are disposed on a base substrate 100 in sequence. In the figure, a light shielding material 115 is provided on a surface of the pattern of source/drain metal layer away from the base substrate 100 so as to provide a light shielding layer, and at the same time, a light shielding material is also provided on a surface of the pattern of gate metal layer adjacent to the base substrate so as to provide a light shielding layer. For example, as depicted in the figure, a light shielding material 115 is provided on a surface of the source/drain metal layer away from the base substrate 100, a light shielding material 115 is provided on a surface of the source/drain metal layer corresponding to the channel region of the TFT, and a light shielding material 115 is provided each on a surface of the pattern of gate metal layer away from the base substrate and on a surface of the pattern of gate metal layer adjacent to the base substrate. Thus, light leakage can be better prevented in the display device, and light is prevented from being irradiated on the channel region of the TFT, thereby increasing the opening ratio of the display device.

It should be noted that, a liquid crystal display device typically comprises a backlight source, while materials for preparing the source/drain metal layer and the gate metal layer, such as aluminum or aluminum alloy, copper or copper alloy, and the like, have a high reflectivity. Thus, light emitted from the backlight source can be reflected and refracted for several times, and the following issues will be raised. On one hand, the light after reflected and refracted will irradiated on the channel region of the TFT from various directions, which causes a leakage current. And on the other hand, the light after reflected and refracted will leak at positions where a black matrix is not provided to block light. These issues all affect the display effect. By providing a light shielding material on both surfaces of the gate metal layer away from the base substrate and adjacent to the base substrate, leakage current in the channel region of the TFT can be avoided or reduced, thereby further reducing light leakage and enhancing display effect.

In an example of the embodiment, for example, the pattern of gate metal layer comprises a gate line and a common electrode line.

In an example of the embodiment, for example, the pixel array structure further comprises a common electrode, wherein the common electrode is connected to the common electrode line through a second through hole.

Referring to FIG. 5, a pattern of gate metal layer, a gate insulating layer, a pattern of active layer, a pattern of source/drain metal layer, a planarization layer, a common electrode 130 and the pixel electrode 140 are disposed on a base substrate 100 in sequence. The pattern of gate metal layer comprises a common electrode line 101, and the common electrode 130 is connected to the common electrode line 101 through a second through hole 118, thus the common electrode line 101 can apply a common voltage signal to the common electrode 130. The array substrate illustrated in the figure has a structure of bottom gate, that is, a gate insulating layer, an active layer, source/drain electrodes, a planarization layer 110 and a common electrode 130 are disposed over the pattern of gate metal layer (on a side of the pattern of gate metal layer away from the base substrate). Thus, the second through hole 118 configured to connect the common electrode 130 and the common electrode line 101 passes through the planarization layer and the gate insulating layer (as illustrated in the figure, a light shielding material 115 is provided on a surface of the common electrode line away from the base substrate 100, the second through hole 118 passes through the light shielding material 115 so as to connect the common electrode and the common electrode line). The common electrode is connected to the common electrode line via metal or other conductors.

In one embodiment, a light shielding material is at least provided partially on a surface of the pattern of source/drain metal layer adjacent to the base substrate. A liquid crystal device typically comprises a backlight source. Materials for preparing the source/drain metal layer and the gate metal layer, such as aluminum or aluminum alloy, copper or copper alloy, and the like, have a high reflectivity. Thus, light emitted from the backlight source will be reflected and refracted for several times, and the following issues will be raised. On one hand, the light after reflected and refracted will irradiated on the channel region of the TFT from various directions, which causes a leakage current. And on the other hand, the light after reflected and refracted will leak, which affects the display effect. By providing a light shielding material on both surfaces of the gate metal layer away from the base substrate and adjacent to the base substrate, light reflection will be effective reduced, leakage current in the channel region of the TFT can be avoided or reduced, thereby further reducing light leakage and enhancing display effect.

In one embodiment, for example, the light shielding material can be molybdenum oxide. By adopting an inorganic material such as molybdenum oxide as a light shielding material, a TFT manufacturing device can be prevented from being contaminated, and light leakage in the array substrate will be reduced and the channel region of the TFT can be effectively protected, thereby enhancing display effect and having promising market prospects.

Embodiment Six

In another embodiment of the present disclosure, in addition to the pixel array structure, the array substrate further comprises a color filter layer. The color filter layer comprises a color filter unit corresponding to respective pixel units. For example, the color filter unit can be a red, green or blue (RGB) filter unit. Such an array substrate is referred to as a COA substrate (Color-filter On Array substrate). And further, when a display panel consists of such a COA substrate, a color filter layer cannot be disposed on a counter substrate any more, and the display panel can have an increased opening ratio and a higher cell-assembling precision.

Figure 7:
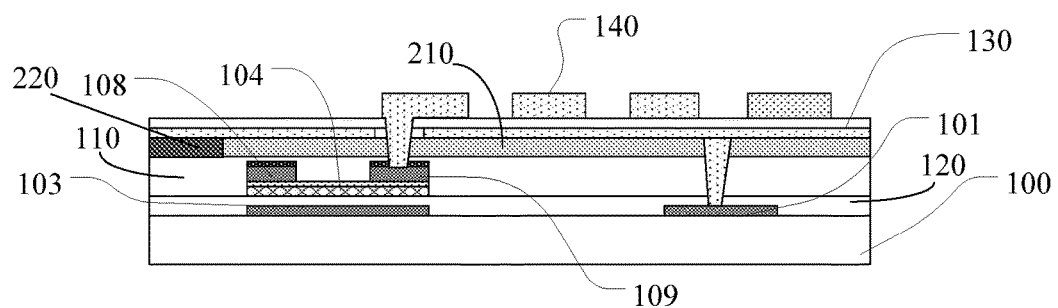
FIG. 7 is an illustrative view of a COA array substrate according to another embodiment of the present disclosure.

FIG. 7 is an illustrative view of a COA array substrate according to another embodiment of the present disclosure. Referring to FIG. 7, the array substrate comprises a base substrate 100 and a pixel array structure disposed on the base substrate 100. The pixel array structure comprises: a pattern of gate metal line which comprises a gate line and a gate electrode 103 connected with the gate line; a gate insulating layer disposed on the pattern of gate metal layer; a pattern of active layer comprising a portion 104 functioning as a channel region of the TFT; and a pattern of source/drain metal layer comprising a data line 107, a source electrode 108 connected with the data line 107, a drain electrode 109 connected with the pixel electrode 140. A light shielding material 115 is provided on a surface of the pattern of source/drain metal layer away from the base substrate 100 so as to provide a light shielding layer. The light shielding material can avoid light leakage or light reflection caused by the source/drain metal layer, thereby increasing the opening ratio of the display device.

Compared with the embodiment as illustrated in FIG. 1c, the array substrate further comprises a color filter layer disposed between the planarization layer 110 and the common electrode 130. The color filter layer further comprises a plurality of color filter units. For example, the pixel unit illustrated in the figure comprises a red filter unit 210, and a neighboring pixel unit comprises a green filter unit or blue filter unit 220.

It should be noted that, each of the array substrates as illustrated in FIGS. 1-7 has a structure of bottom gate, and embodiments of the present disclosure are also suitable for an array substrate having a structure of top gate.

The above embodiments can be combined with each other to obtain better technical effects. For example, a light shielding material is provided on both surfaces of the source/drain metal layer away from the base substrate and adjacent to the base substrate, a light shielding material is provided on both surfaces of the gate metal layer away from the base substrate and adjacent to the base substrate, and a light shielding material is provided corresponding to the channel region of the TFT, thereby better preventing light emitted from the backlight source from being reflected and being refracted, decreasing light leakage, and protecting the channel region of the TFT, so as to obtain better display effect.

Embodiment Seven

Embodiments of another aspect of the present disclosure provide a display device, comprising any one of the array substrate as described above. Because of the array substrate, the display device has the technical effects as described above, and can be described with reference to the previous description. Additionally, a counter substrate (such as a color filter substrate) which is cell-assembled with the array substrate, for example, cannot be provided a black matrix, thereby further simplifying a structure of the counter substrate. In the case that the array substrate is a COA substrate, the counter substrate can further require no color filter layer.

Embodiment Eight

Embodiments of yet another aspect of the present disclosure provide a method for manufacturing an array substrate, comprising: providing a base substrate; forming a pixel array substrate on the base substrate, wherein the pixel array substrate comprises at least one light shielding layer made of a light shielding material.

For example, the pixel array structure further comprises a pattern of source/drain metal layer, and a light shielding material is provided at least on a part of a surface of the pattern of source/drain metal layer away from the base substrate, so as to provide a light shielding layer.

In the array substrate manufactured by the method according to the embodiment of the present disclosure, a light shielding material is provided at least on a part of the surface of the pattern of source/drain metal layer away from the base substrate so as to provide a light shielding layer, thereby effectively preventing light leakage of a display device (for example). And at the same time, as a black matrix functioning as a light shielding material is provided at the side of the array substrate, the offset in the cell-assembling is removed. Thus, the black matrix has a relatively small width, thereby increasing the opening ratio.

For example, processes for forming the pattern of source/drain metal layer comprise: depositing a source/drain metal layer and a light shielding material layer, patterning the source/drain metal layer and the light shielding material layer through a single patterning process, so as to the pattern of source/drain metal layer, a part of surface of which is formed with a light shielding material. Herein, as a pattern of the light shielding material is formed simultaneously with the pattern of source/drain metal layer, no additional process is required, and the array substrate can be manufactured at a low cost. And at the same time, the resulted light shielding material layer completely covers the pattern of source/drain metal layer, thereby better preventing light leakage.

For example, the pixel array structure further comprises a pattern of gate metal layer, wherein processes for forming the pattern of gate metal layer comprises: depositing a gate metal layer and a light shielding material layer on the base substrate, patterning the gate metal layer and the light shielding material layer through a single mask process, so as to form the pattern of gate metal layer, forming a light shielding material at least on a part of a surface of the pattern of gate metal layer away from the base substrate. Herein, the pattern of light shielding layer and the pattern of gate metal layer are deposited in sequence, and are formed through one mask etching, and no additional processes are required, and the array substrate can be manufactured at a low cost. And at the same time, as a light shielding material layer is provided on a surface of the pattern of gate metal layer away from the base substrate, thus avoiding leakage current due to the reflected and refracted light irradiating on the channel region of the TFT.

For example, the pixel array substrate can further comprise a pattern of active layer, the pattern of active layer comprising a region of the TFT.

In an example of the embodiment, after forming the pattern of source/drain metal layer, the method can further comprise: forming a planarization layer on the pattern of the source/drain metal layer, depositing a common electrode layer and a light shielding material layer, and etching the common electrode layer and the light shielding material layer to form a common electrode, on which a light shielding material is provided corresponding to the channel region of the TFT. By forming a light shielding material layer on the channel region of the TFT, light can be prevented from irradiating on the channel region of the TFT, and leakage current is prevented. And at the same time, as the light shielding material layer is provided on the side of the array substrate, offset in cell-assembling is removed, the light shielding material layer has a relatively small size, thereby increasing the opening ratio.

For example, after forming the common electrode, the method according to the embodiment of the present disclosure can further comprise: forming an interlayer insulating layer and forming a first through hole and a pixel electrode, and connecting the pixel electrode to a drain electrode of the TFT through the first through hole. For example, after forming a common electrode on the planarization layer, a through hole (or opening) is reserved at a position of the common electrode corresponding to the drain electrode, thereby facilitating forming a first through hole passing through the interlayer insulating layer and the planarization layer after forming the interlayer insulating layer.

For example, in the structure described above, the light shielding material is Molybdenum oxide. By adopting Molybdenum oxide, an inorganic material, as the light shielding material, the TFT manufacturing device can be prevented from being contaminated and the channel region of the TFT can be effectively protected, thereby reducing light leakage in the array substrate and enhancing display effect, thus having promising market prospects.

The method for manufacturing an array substrate according to embodiments of the present disclosure will be described in detail hereinafter, just taking providing a pattern of light shielding material layer on a surface of the pattern of source/drain metal layer away from the base substrate and on the common electrode corresponding to the channel region of the TFT as an example.

(1) forming a pattern of gate metal layer

Forming a metal film layer on a base substrate such as a glass base substrate, for example, the metal film layer is made of aluminum; coating a photoresist layer on the metal film layer, removing the photoresist rather than a portion of the photoresist on the pattern of gate metal layer by exposing through a mask, so as to expose a portion of the metal film layer to be etched, thus obtaining a pattern of the photoresist. A positive photoresist or a negative photoresist can be sued. For example, a portion of the metal film layer exposed by the pattern of the photoresist is etched by an etching solution. And then, the remaining photoresist is removed so as to form a pattern of gate metal layer. For example, the pattern of gate metal layer comprises a gate line and a gate electrode connected with the gate line, and can further comprise a common electrode line.

Then, a gate insulating layer is formed on the pattern of gate metal layer so as to cover the pattern of gate metal layer.

(2) forming a pattern of active layer and a pattern of source/drain metal layer, wherein a light shielding material is provided on a surface of the pattern of source/drain metal layer away from the base substrate.

For example, an active layer, a source/drain metal layer and a Molybdenum oxide layer are deposited on the gate insulating layer in sequence.

Molybdenum oxide is one of the light shielding materials according to the embodiments of the present disclosure, is black and has a light shielding effect similar to a black matrix. For example, process for depositing Molybdenum oxide can be carried out in different chambers of a same device in which process for sputtering the metal layer is carried out, and the two processes are carried out in sequence. A target for sputtering Molybdenum oxide is a Molybdenum target or a Molybdenum niobium target, and a gas used is oxygen or argon, for example.

A photoresist layer is coated on the Molybdenum oxide layer, and a pattern of source/drain metal layer and a region channel region of the active layer through a halftone or a gray tone mask process. A positive photoresist is used in the half tone or gray tone mask process. A transmission region of the mask used corresponds to the active layer, the source/drain metal layer, a portion of the Molybdenum oxide layer to be etched. A semi-transmission region or a partial transmission region of the mask corresponds to the channel region, and the opaque region of the mask corresponds to the pattern of the source/drain metal layer. After exposing and developing the photoresist through the mask, a portion of the photoresist corresponding to the transmission region is removed, a portion of the photoresist corresponding to the semi-transmission region or a partial transmission region is partially remained (a width thereof is reduced), and a portion of the photoresist corresponding to the opaque region is substantially remained, thereby obtain a pattern of photoresist. Etching by taking the pattern of photoresist as a mask, for example, exposed portion of the Molybdenum oxide layer is removed through one etching solution so as to form a pattern of Molybdenum oxide layer, and next, an exposed portion of the source/drain metal layer is etched through another etching solution so as to form the pattern of source/drain metal layer, wherein the Molybdenum oxide covers a surface of the pattern of source/drain metal layer away from the base substrate, and next, an exposed portion of the active layer is etched through another etching solution. And then, the pattern of photoresist is ashed so as to remove a portion of the photoresist corresponding to the semi transmission region of the partial transmission region, which a portion of the photoresist corresponding to the opaque region is partially remained (reducing the thickness thereof), an exposed portion of Molybdenum oxide and an exposed portion of the source/drain metal layer which correspond to the channel region are respectively etched through an etching solution, so as to form the channel of the TFT; and finally, removing the photoresist.

(3) Forming a planarization layer and a pattern of the through hole.

A planarization layer is deposited, and a pattern of through hole is formed through a mask exposing process if necessary, description of which can refer to the description above. The through hole is configured to electrically connect the common electrode line to a common electrode formed subsequently.

(4) forming a common electrode and a molybdenum oxide layer corresponding to the channel region of the TFT.

An ITO (Indium tin oxide) layer and a molybdenum oxide layer are deposited, the ITO layer configured to form a common electrode. The molybdenum oxide layer and the ITO layer are patterned through half tone or gray tone through a lithography process. A photoresist, such as a positive photoresist, on the molybdenum oxide layer. A transmission region of a half tone or gray tone mask corresponds to a region rather than a region of the common electrode. A semi transmission region or a partial transmission region of the mask corresponds to a region of the common electrode except a region reserved for the remained molybdenum oxide. An opaque region of the mask corresponds to a region reserved for the remained molybdenum oxide. The photoresist is exposed through the half tone or gray tone mask, so as to obtain a pattern of the photoresist. Exposed molybdenum oxide material and ITO material are removed by using the pattern of photoresist. And then, the photoresist corresponding to the semi transmission region or the partial transmission region of the mask is removed by performing an ashing process, while the photoresist corresponding to the opaque region is partially remained (thickness thereof is reduced), such that the molybdenum oxide material disposed on the common electrode is partially exposed. And next, the exposed molybdenum oxide material is removed by etching such that the common electrode is formed. And then, the remaining photoresist is removed. And further, the common electrode has an opening at a position for a through hole to be formed for connecting the pixel electrode and the drain electrode of the TFT.

In addition, a portion of the mask corresponding to the channel region of the TFT is an opaque region such that a light shielding material covers the channel region of the TFT just above.

(5) Forming an interlayer insulating layer and a through hole

An interlayer insulating layer is deposited on the common electrode layer, and a pattern of a through hole is formed through a mask exposure process. Please refer to the previous description.

(6) Forming a pixel electrode

An additional ITO layer is deposited on the interlayer insulating layer, and is patterned through masking, exposing and etching, so as to obtain a pattern of pixel electrode. The pixel electrode is connected to the drain electrode in the source/drain metal layer through the through hole.

In the array substrate formed by such a method, a light shielding material, such as molybdenum oxide, is coated on the pattern of source/drain metal layer and on a region of the common electrode corresponding to the channel region of the TFT, thereby effectively preventing light leakage and protecting the channel region of the TFT. And as offset in cell-assembling is removed, the opening ration is increased. Please refer to previous description.

In an example of the embodiment, after forming a planarization layer on the pattern of source/drain metal layer, i.e., between (3) and (4), for example, a process for forming color filter units of three principle colors on the planarization layer. For example, RGB filter units are formed corresponding to a pixel unit, thus obtaining a COA substrate.

For example, processes for forming RGB filter units can be performed as below: forming a red color filter layer through for example coating, and then forming a red color filter through a photolithographic process and an etching process; and next, forming a green color filter layer through for example coating, and then forming a green color filter through a photolithographic process and an etching process; and forming a blue color filter layer, and then forming a blue color filter through a photolithographic process and an etching process. These RGB filter units can be arranged juxtaposed to each other, or can partially overlap each other at their boundaries.

Herein, as a process for forming color filter units is introduced between (3) and (4), if the color filter units cover a position corresponding to the drain of the TFT, it is required to etch corresponding color filter layer in the color filter units when forming a through hole connecting to the drain of the TFT. For example, in the formed array substrate, the through hole passes through the planarization layer, the color filter layer, RGB sub-pixels, and the molybdenum oxide. Of course, if a position of the formed color filter units corresponding to the drain of the TFT is exposed, it is not required to etch corresponding color filter layer in the color filter units when forming the through hole.

That is to say, the embodiments of the present disclosure can not only be applied to a case that the three principle colors filter units are disposed at the side of the color filter substrate, but also applied to a case that the three principle colors filter units are disposed at the side of the array substrate, each of which falls into the protection scope of the present disclosure.

Similarly, in the embodiments of the present disclosure, in manufacturing the array substrate, for example, a light shielding material such as molybdenum oxide is provided on a surface of the pattern of source/drain metal layer away from the base substrate, on surface of the pattern of gate metal layer away from the base substrate and adjacent to the base substrate, and on a region corresponding to the channel region of the TFT, so as to provide light shielding layers, thereby further avoiding occurrence of leakage current in the channel region of the TFT due to light reflection or light refraction and improving display effects.

Methods for manufacturing array substrates with other structures according to the embodiments of the present disclosure are similar to the method as described above, and will not be elaborated herein.

Herein, the terms "the first" and "the second" are only used to distinguish one entity or operation from another entity or operation, and does not require or imply that there is a relationship or a sequence between these entities or operations. The terms "comprising" and "including" are opening expressions, and are not used to exclude other elements than the contained processes, methods, and articles. It should be noted that, directional relationships or positional relationships indicated by the terms "above", "below" and the like are just directional relationships or positional relationships indicated on the basis of the figures, and are used for purpose of describing the present disclosure and simplifying the description, rather than suggesting or implying that the referred devices or elements must have a specific orientation, or be configured and operated in a specific orientation, and thus cannot be construed as a limit to the present disclosure. Unless definitely defined or limited, the terms "mounted to", "connected to" and "connected with" should be understood broadly, for example, the terms can refer to a fixed connection, a detachable connection, or an integrated connection, and can be a mechanical connection or an electrical connection, and can be a direct connection or an indirect connection through a medium, or a connection inside two elements. As for one of ordinary skill in the art, he can understand the specific meaning of the terms mentioned above in the present disclosure according to specific circumstances.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201610352949.7 filed on May 25, 2016, the disclosure of which is hereby entirely incorporated by reference.

The invention claimed is:

1. An array substrate, comprising a base substrate and a pixel array substrate disposed on the base substrate, wherein the pixel array substrate comprises at least one light shielding layer made of light shielding material,
   wherein the pixel array substrate further comprises a pattern of source/drain metal layer, the pattern of source/drain metal layer comprises a source electrode and a drain electrode of the thin film transistor and a data line and the light shielding material is disposed on both surfaces of the pattern of source/drain metal layer away from the base substrate and adjacent to the base substrate so as to provide light shielding layers; and
   wherein a pattern of the light shielding material corresponds to the/drain metal layer in a thickness direction of the base substrate.

2. The array substrate according to claim 1, wherein the pixel array substrate further comprises a thin film transistor, the thin film transistor comprises a pattern of active layer, and the light shielding layer is disposed at least corresponding to the pattern of active layer.

3. The array substrate according to claim 1, wherein the pixel array substrate further comprises a common electrode, and the light shielding material is disposed on a surface of the common electrode away from the base substrate so as to provide the light shielding layer.

4. The array substrate according to claim 3, wherein the pixel array substrate further comprises a planarization layer and a pixel electrode insulated from the common electrode,
   wherein the pixel electrode is connected to the drain electrode through a first through hole passing through the common electrode and the planarization layer.

5. The array substrate according to claim 1, wherein the pixel array substrate further comprises a pixel electrode, and the light shielding material is provided on a surface of the pixel electrode away from the base substrate so as to provide the light shielding layer.

6. The array substrate according to claim 5, wherein the pixel array substrate further comprises a planarization layer between the pattern of source/drain electrode layer and the pixel electrode, and the pixel electrode is connected to the drain electrode through a through hole passing through the planarization layer.

7. The array substrate according to claim 1, wherein the pixel array substrate further comprises a planarization layer, and the light shielding material is provided on a surface of the planarization layer away from the base substrate so as to provide the light shielding layer.

8. The array substrate according to claim 1, wherein the pixel array substrate further comprises a pattern of gate metal layer, and the light shielding material is provided on a surface of the pattern of gate metal layer away from the base substrate so as to provide the light shielding layer.

9. The array substrate according to claim 8, wherein the light shielding material is provided on a surface of the pattern of gate metal layer adjacent to the base substrate so as to provide the light shielding layer.

10. The array substrate according to claim 8, wherein the pattern of gate metal layer comprises a gate electrode of the thin film transistor, a gate line and a common electrode line.

11. The array substrate according to claim 1, wherein the pixel array substrate further comprises a gate line, a data line, a pixel electrode and a common electrode, the pixel electrode and the common electrode are insulated from each other and disposed on the same level or on different levels, and the common electrode and/or the pixel electrode covers the gate line and/or the data line.

12. The array substrate according to claim 1, wherein the light shielding material is molybdenum oxide.

13. The array substrate according to claim 1, wherein the pixel array structure further comprises a color filter layer which comprises a plurality of color filter units.

14. A display device, comprising the array substrate according to claim 1.

15. A method for manufacturing an array substrate, comprising:
providing a base substrate; and
forming a pixel array structure on the base substrate;
wherein the pixel array structure comprises at least one light shielding layer made of light shielding material;
wherein the pixel array substrate further comprises a pattern of source/drain metal layer, the pattern of source/drain metal layer comprises a source electrode and a drain electrode of the thin film transistor and a data line, and the light shielding material is disposed on, both surfaces of the pattern of source/drain metal layer away from the base substrate and adjacent to the base substrate, so as to provide light shielding layers; and
wherein a pattern of the light shielding material corresponds to the pattern of source/drain metal layer in a thickness direction of the base substrate.

16. The method for manufacturing an array substrate according to claim 15, wherein the pixel array structure further comprises a thin film transistor, the thin film transistor comprises a pattern of active layer, wherein the light shielding layer is disposed at least corresponding to the pattern of active layer.

17. The method for manufacturing an array substrate according to claim 15, wherein the pixel array structure further comprises a common electrode, and the light shielding material is provided on a surface of the common electrode away from the base substrate so as to provide the light shielding layer.

18. The method for manufacturing an array substrate according to claim 15, wherein the pixel array structure further comprises a pixel electrode, and the light shielding material is provided on a surface of the pixel electrode away from the base substrate so as to provide the light shielding layer.

19. The method for manufacturing an array substrate according to claim 15, wherein the pixel array structure further comprises a planarization layer, and the light shielding material is provided on a surface of the planarization layer away from the base substrate so as to provide the light shielding layer.

20. The method for manufacturing an array substrate according to claim 15, wherein the pixel array structure further comprises a pattern of gate metal layer, and the light shielding material is provided on a surface of the pattern of gate metal layer away from the base substrate so as to provide the light shielding layer.

21. The method for manufacturing an array substrate according to claim 15, wherein the light shielding material is molybdenum oxide.

22. The method for manufacturing an array substrate according to claim 15, wherein the pixel array structure further comprises a color filter layer, which comprises a plurality of color filter units.

* * * * *